United States Patent [19]
Chew et al.

[11] Patent Number: 5,332,443
[45] Date of Patent: Jul. 26, 1994

[54] LIFT FINGERS FOR SUBSTRATE PROCESSING APPARATUS

[75] Inventors: Sandy M.-S. Chew, Fremont; Shane D. Clark, Livermore; Ron L. Rose; Dale R. DuBois, both of Los Gatos; Cissy Leung, Fremont; Alan F. Morrison; Manus K. Wong, both of San Jose, all of Calif.

[73] Assignee: Applied Materials, Inc., Santa Clara, Calif.

[21] Appl. No.: 73,958

[22] Filed: Jun. 9, 1993

[51] Int. Cl.⁵ ............................................. C23C 16/00
[52] U.S. Cl. .................................. 118/729; 118/715; 118/728; 156/345
[58] Field of Search .................. 118/715, 728, 729; 156/345

[56] References Cited
U.S. PATENT DOCUMENTS
5,000,113 5/1991 Wang ........................... 118/715

Primary Examiner—Richard Bueker
Attorney, Agent, or Firm—Craig P. Opperman

[57] ABSTRACT

A substrate lifting apparatus for use in a substrate processing apparatus which includes a thermal reactor having a substrate processing chamber and a substrate support located in the chamber. The lifting apparatus consists of a generally circular shaped support with four seats formed therein; four substrate lifting elements, each having a substrate engaging end and a securing tab sized to be received in a seat; a fastener, associated with each lifting element, which secures the tab into the seat; and an adjuster, associated with each lifting element, located between the tab and the seat. When the tab is secured in the seat and the adjuster is operated, the lifting element is caused to move in a plane parallel to a plane formed through the center of the fastener and the adjuster.

20 Claims, 5 Drawing Sheets

LIFT FINGERS FOR SUBSTRATE PROCESSING APPARATUS

BACKGROUND OF THE INVENTION

1. Field of the Invention

This invention relates to substrate processing apparatus and, more particularly, to an improved substrate lift finger for use in such apparatus.

2. Background

Substrates, such as semiconductor wafers, which require chemical processing are typically processed in thermal reactors. A large number of different reactors exist and, to illustrate the application of this invention, one such reactor (a chemical vapor deposition (CVD) thermal reactor) is illustrated in FIG. 1.

In this figure the reactor 10 is shown to include sidewalls 12, a top 14 and a bottom 16 which together define a thermal processing chamber 18 in which a substrate in the form of a semiconductor wafer 20 is located. The wafer 20 is supported on a susceptor 22 and can be lifted from the susceptor's surface by four lift fingers 24 which pass, from below, through holes 25 formed through the susceptor. The fingers 24 are mounted on a support hoop 26 and are moved vertically up and down under action of a drive motor 28 which is connected to the hoop at connecting tab 29. The susceptor 22 is able to move vertically up and down under action of a further drive motor 30 which is connected to the susceptor by means of an arm 31.

As a result of this configuration, the fingers are able to move upwards relative to the susceptor 22 to contact the underside of the wafer 20 and lift it from the upper surface of the susceptor 22. This operation is necessary so that the wafer 20 can be removed from the chamber 18. Once the wafer 20 has been lifted clear of the susceptor, a robot arm (not shown) enters the chamber through an aperture 32 formed in the back wall of the reactor 10. The robot arm is then positioned between the susceptor and the wafer 20 after which the fingers are moved downward until the wafer 20 is supported entirely by the robot arm. The fingers then move still further down to clear the underside of the wafer, after which the robot arm is retracted to remove the wafer 20 from the chamber 18.

Similarly, when a fresh, unprocessed wafer is to be inserted into the chamber 18 the robot arm brings the wafer into the chamber and holds it above the fingers 24. The fingers 24 are then moved up to engage the underside of the wafer to lift it from the robot arm. Thereafter, the robot arm is withdrawn from the chamber 18 and the fingers are moved down and the susceptor up until the susceptor 22 supports the wafer. After this wafer processing commences.

FIG. 1 also shows a bank of tungsten carbide heater lamps 34 which are located below the reactor 16. These heater lamps 34 serve to heat the susceptor 22 by means of thermal radiation which passes from the lamps through a quartz window 36 formed in the bottom wall 16 of the reactor 10. These heater lamps heat the susceptor which, in turn, heats the wafer 20 by means of conduction. During processing operations, processing gasses are injected into the chamber 18 by means of an injection fixture, commonly called a shower head 38, which operates to spread processing gasses evenly over the entire surface of the wafer.

The configuration of the conventional lift fingers 24 and their associated support hoop 26 is illustrated in greater detail in FIG. 2 which is an exploded pictorial view of the hoop 26. In this figure only one of the four fingers 24 is shown. The finger 24 (typically made of alumina ceramic) is generally U-shaped and includes an attachment tab 40 at the top of one leg and a wafer underside engaging tip 42 at the top of the other leg. The tab 40 of the finger 24 seats and is secured in a socket 44 formed in the hoop 26. The hoop 26 is also made of alumina ceramic and has an area that has been cut away so that it does not define a full circle. The cut away portion is formed to accommodate the arm 31 of the susceptor 22. This allows the hoop 26 to move close up against the underside of the susceptor 22 when the wafer 20 is lifted from the susceptor.

The lift finger 24 is secured to the support hoop 26 in a manner illustrated by reference to both FIGS. 2 and 3 in which FIG. 3 is a partially sectioned cross-section along the line 3—3 in FIG. 2 and shows the lift finger 24 secured in the seat 44.

A clamp 50 is bolted over the top of the tab 40 of the finger 24 by means of a clamp pin 52. The clamp pin 52 passes through both the clamp and the tab 40 and is secured at its lower end by means of a nut and a locknut combination 54 which bear against a Belleville washer combination 56. The Belleville washer combination 56 is made of two cup-like washers which are made of a resilient material and are placed back to back. The combination acts as a spring between the nut combination 54 and the tab 40. This ensures that the nut combination 54 does not bear directly against the tab 40 and thereby reduces the chances of fracturing the ceramic tab.

The clamp 50 is, in turn, fastened to the seat 44 by means of a pair of screws 58 which pass through the clamp and the portion of the hoop 26 below the seat 44 to screw into a plate 60 (not shown in FIG. 2) located underneath the hoop 26. As with clamp pin 52, the screws 58 bear against a Belleville washer combination 62. Furthermore, a pair of adjustment set screws 64 are provided to screw through the clamp 50 to bear against the seat 44.

During the assembly of the hoop, the fingers must be properly adjusted. This adjustment is required to (a) align the wafer supporting tips 42 of the fingers 24 with corresponding holes in the susceptor and (b) insure that all four wafer supporting tips 42 together define a flat, horizontal plane so that the wafer 20 can be properly supported by them. The adjustment of the lift finger 24 is achieved by adjusting the set screws 44 together with or independently of adjusting the pair of screws 58.

The above design has two major flaws. Firstly, apart from the lift finger 24 and the support hoop 26 (which are ceramic) and the Belleville washers (which are of a metal such as inconel) all the other components shown in FIGS. 2 and 3 are made from a commercial product sold under the trade name Haynes 240 ® by the Haynes International Company. Even though this material is very hard and very expensive to machine, it is necessary to use in this application as ceramic can not be formed with the screw threads required to provide the various clamping and adjustment functions. Apart from being very expensive to fabricate, Haynes 240 ® also has the disadvantage that, under the typical reaction temperatures in CVD chamber (about 470° C.) it oxidizes and blackens over time. This oxidization/blackening could generate unwanted particles in the chamber and detrimentally affect the processing of the wafer.

The arrangement described above has a second disadvantage in that the fingers 24 are extremely difficult and time consuming to align correctly. This is primarily because a large number of different screws and bolts that need to be coordinated to produce the required alignment of the tips 42 of the four lift fingers 24. This problem is compounded by the plate 60 which is located beneath the ring 26 and which is very difficult to align with the screws 58. It has been found that the plate can be misaligned and not engaged correctly by the screws 58. This causes the plate to become dislodged during processing operations which, in turn, can cause damage to reflectors (not shown) located inside the chamber 18 as the hoop 26 is moved up and down under action of drive 28.

Accordingly a need exists for a different and improved configuration of wafer lift fingers and supporting hoop.

SUMMARY OF THE INVENTION

Briefly, this invention provides for a substrate lifting apparatus for use with a thermal reactor which includes a substrate processing chamber and a substrate support located in the chamber. The lifting apparatus consists of a generally circular shaped support with four seats formed therein; four substrate lifting elements, each having a substrate engaging end and a securing tab sized to be received in a seat; a fastener, associated with each lifting element and which secures the tab into the seat; and an adjuster, associated with each lifting element, located between the tab and the seat. When the tab is secured in the seat and the adjuster is operated, the lifting element is caused to move in a plane parallel to a plane formed through the center of the fastener and the adjuster.

The adjuster operates to pivot the tab in the seat to cause the lifting element to move in a vertical plane parallel to the plane through the center of the fastener and the adjuster.

Each lifting element has a generally U-shaped configuration with the substate engaging end at the tip of one of the legs of the U-shape and the securing tab located at the end of the other leg of the U-shape.

The fastener includes an elongate fastening element which passes through the tab and the body of the hoop, and the adjustment means includes an elongate, threaded element which, on rotation, is adjustable in height to vary the spacing between the tab and the seat thereby causing the lifting element to move in a plane parallel to a plane defined by the logitudianl axes of the fastening element and the threaded element respectively.

The fastener also includes a spring bias, typically a Belleville washer combination, which biases the tab into the seat. The threaded adjuster element operates to pivot the tab against the bias of the spring.

The invention also provides for a fastener cover plate for covering the fastener. Typically the fastener and adjuster are made of a metal such as nickel or inconel and the cover plate, lifting element and lifting element support of an aluminum ceramic. The cover plate operates to reduce the amount of substrate processing gases from coming into contact with the fastener and the adjuster.

IN THE DRAWING

DETAILED DESCRIPTION OF A PREFERRED EMBODIMENT

Figure 1:
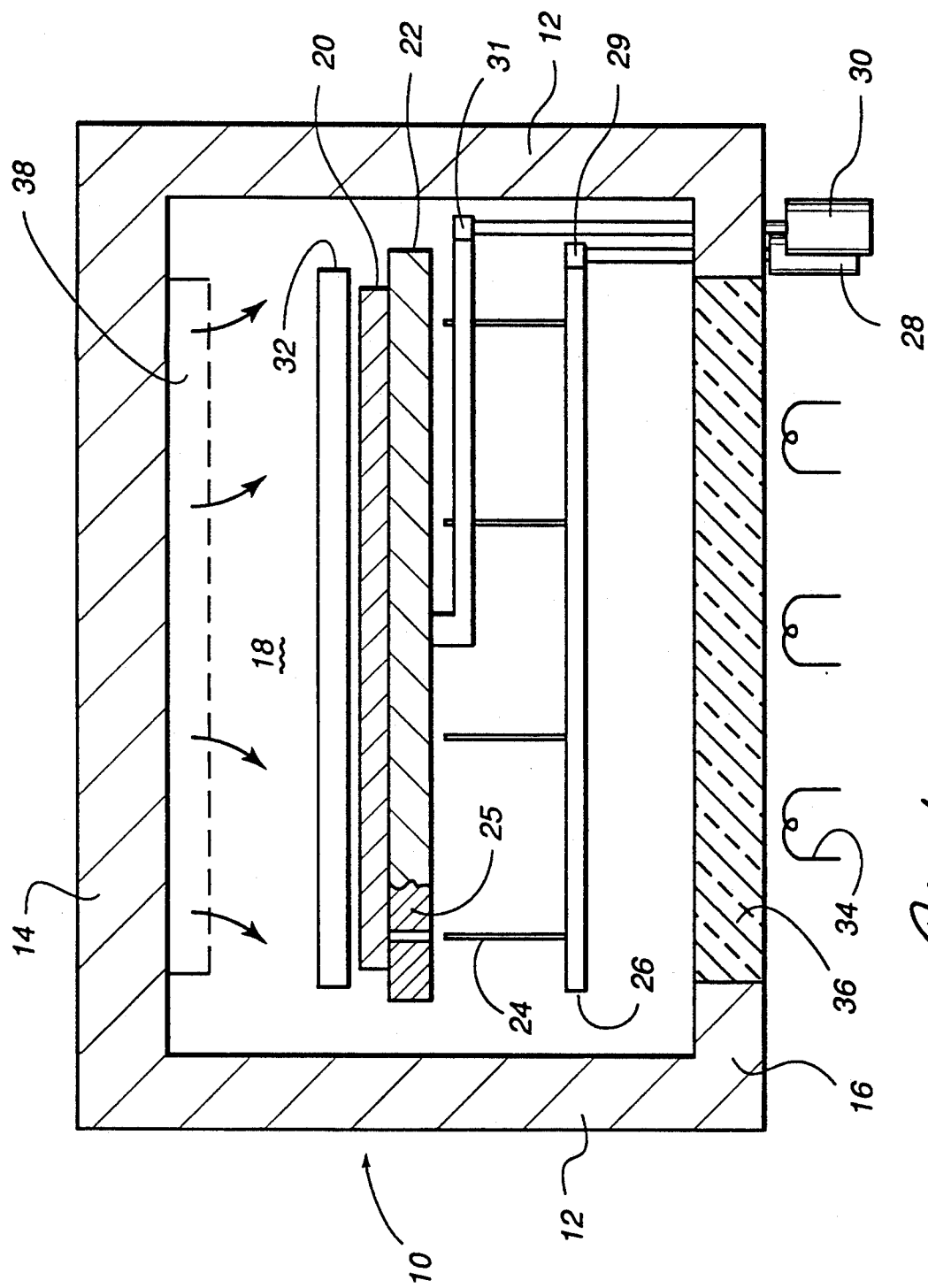
FIG. 1 is a schematic cross-section through a typical chemical vapor deposition chamber.
Figure 2:
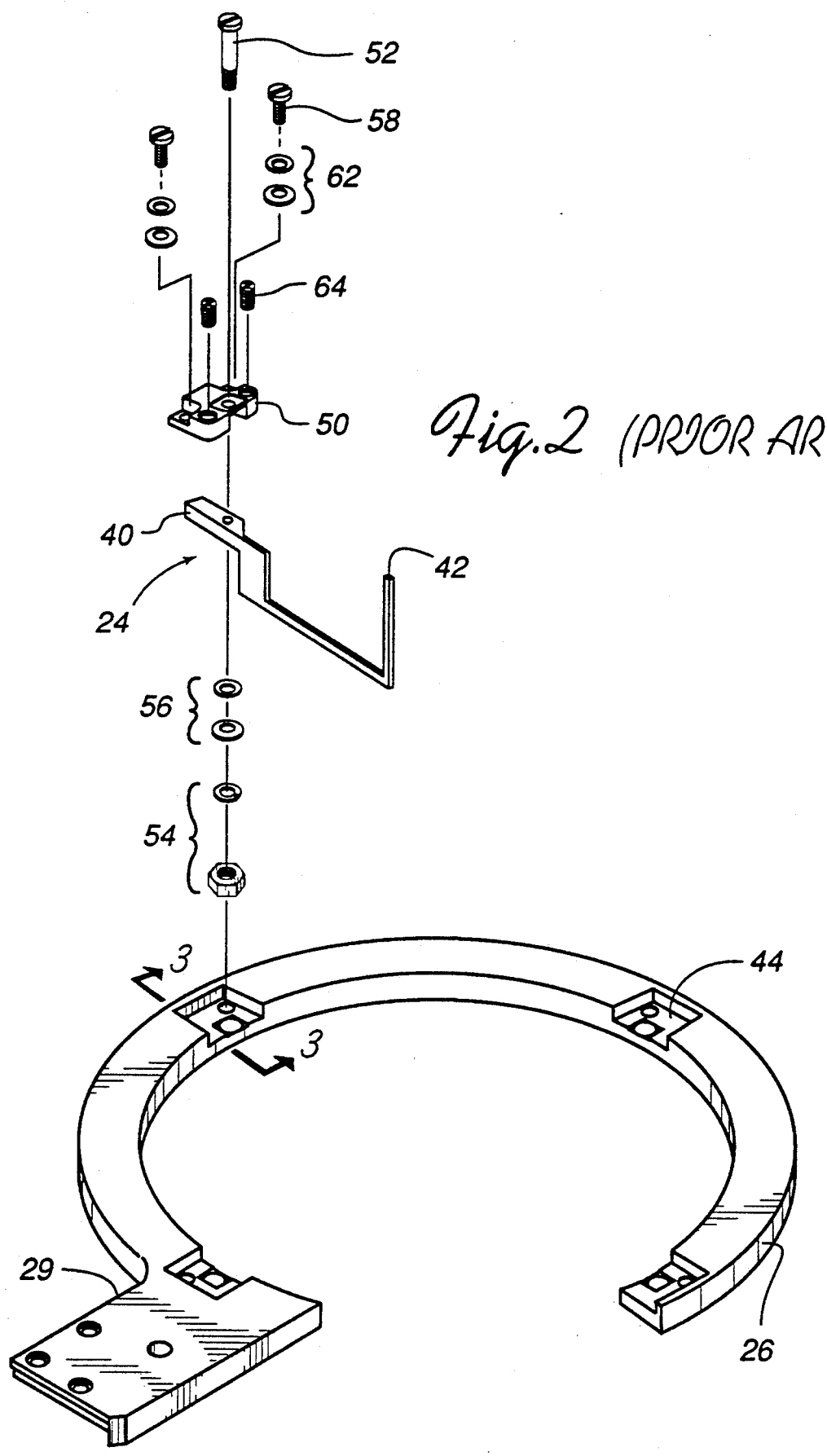
FIG. 2 is an exploded pictorial depiction of a prior art wafer finger support hoop and one of its associated lift fingers.
Figure 3:
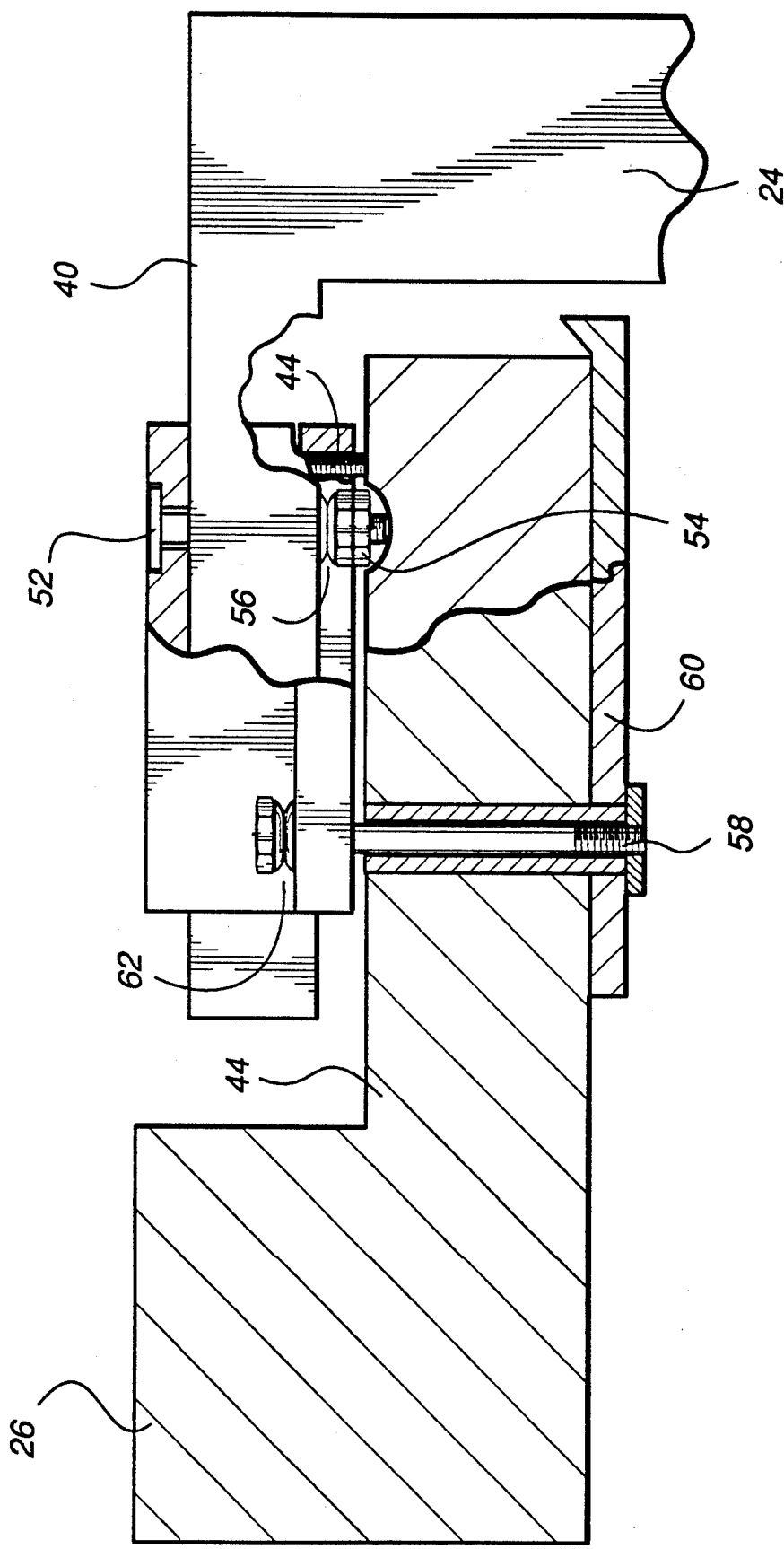
FIG. 3 is a cross-section taken along line 3—3 in FIG. 2.
Figure 4:
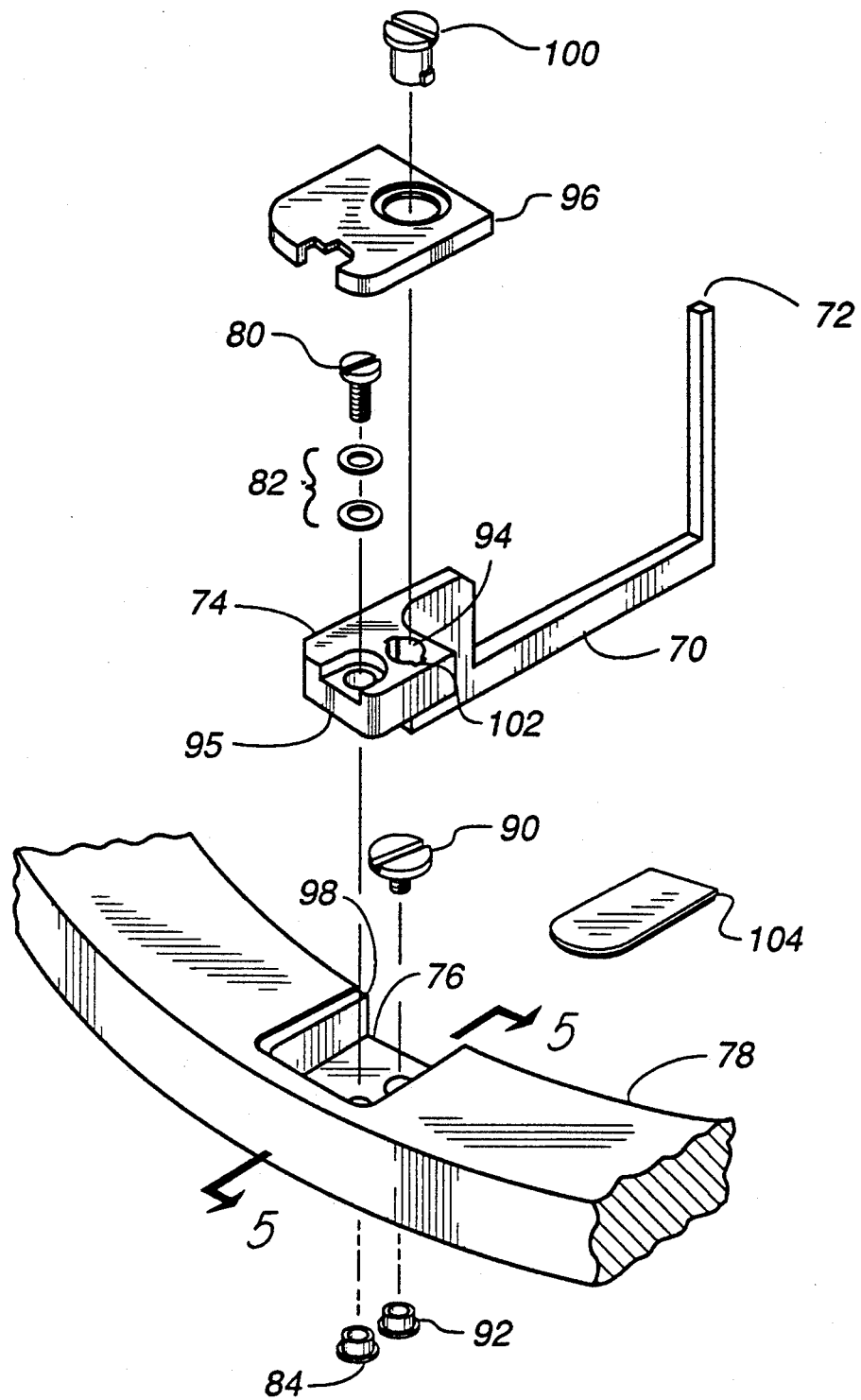
FIG. 4 is an exploded pictorial depiction of the lift finger of the invention.
Figure 5:
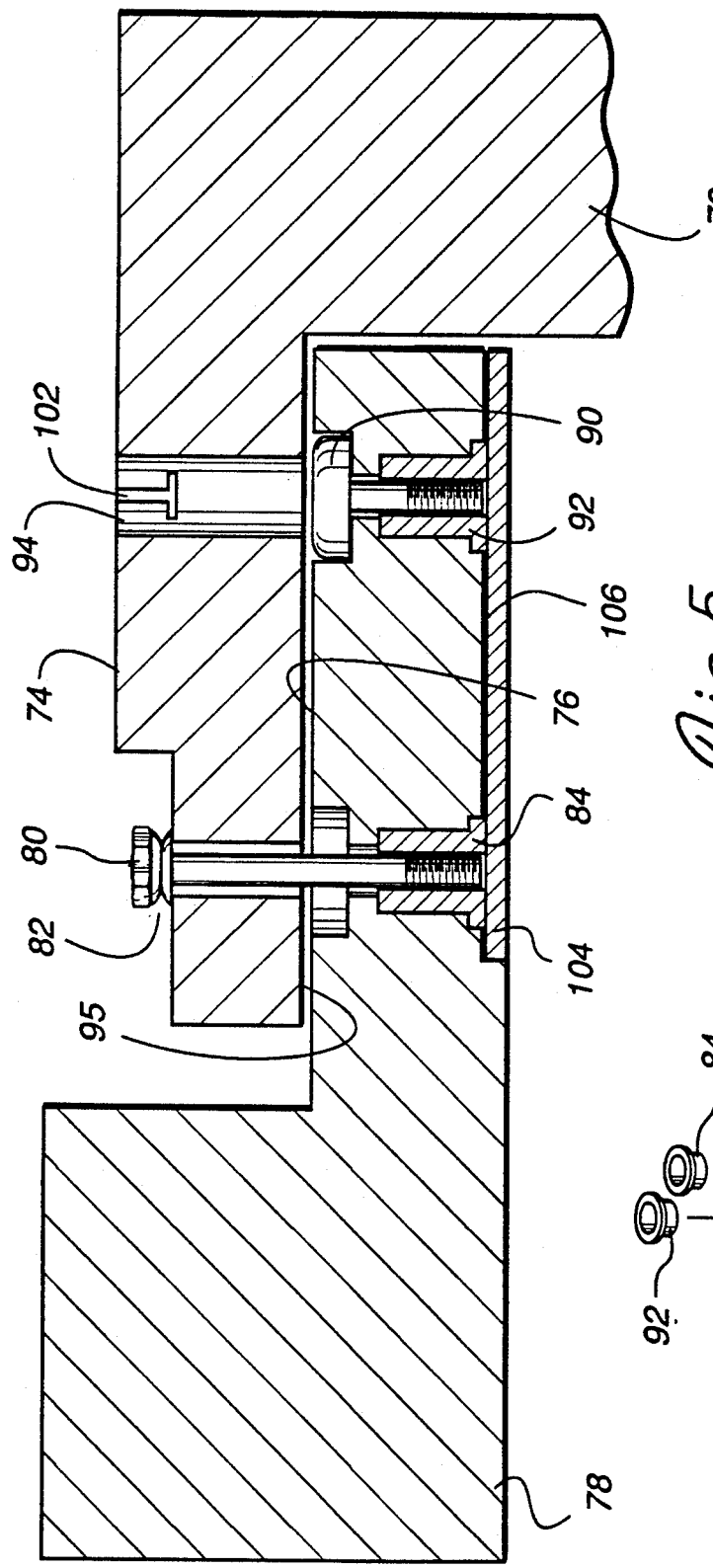
FIG. 5 is a cross-section along line 5—5 in FIG. 4.
Figure 6:
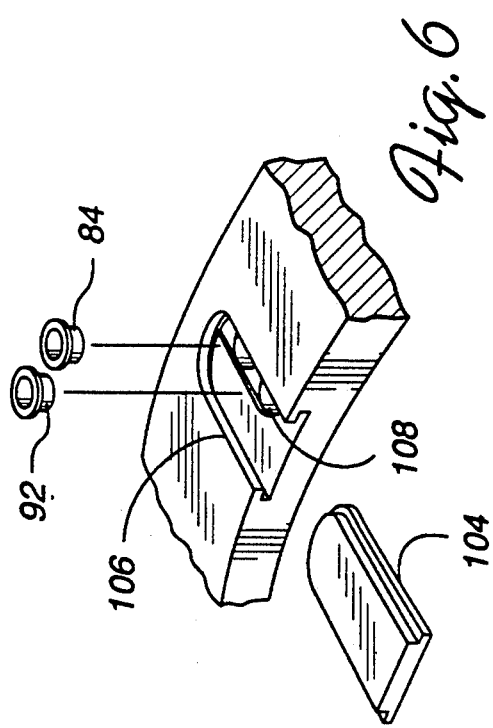
FIG. 6 is a pictorial view of the underside of the portion of the hoop illustrated in FIG. 4.

This invention is illustrated in FIGS. 4, 5 and 6. In FIG. 4 a semiconductor wafer lift finger 70 is shown to have a generally U-shaped configuration which, at the end of one of the legs of the U-shape, has a wafer supporting tip 72. At the end of the other leg of the U-shape, a securing tab 74 is located. This securing tab is shaped to be received in a seat 76 formed in a supporting hoop 78 of which only a part is shown.

As shown in both FIGS. 4 and 5, the tab 74 is secured into the seat 76 by means of a screw 80 made from inconel (a corrosion resistant alloy of nickel, chromium and iron) which bears down onto a pair of nickel plated Belleville washers 82 which, in turn, bear onto the tab 74. The screw 80 passes through both the tab 74 and the hoop 78 to be secured at the underside of the hoop by a nickel securing nut 84.

An adjustment screw 90 is shown positioned so that its head lies between the seat 76 and the underside of the tab 74. The adjustment screw 90 passes through the support hoop 78 and is secured at the underside thereof by means of a nickel nut 92. As is described below, this nut 92, as well as nut 84, are held in position in the underside of the hoop 78. The screw 90 can be accessed through an aperture 94 formed through the tab 74. Adjustment is done by inserting a suitable tool such as a screwdriver into the aperture 94 and turning the screw 90 in or out. If the adjustment screw 90 is turned in the direction causing its head to move downwards into the hoop 78 the securing screw 80 together with the Belleville washers 82 act to pull the tab 74 to follow the screw 90. This causes the tab to pivot about its lower, outer edge 95 thereby lowering the tip 72 of the lift finger. Alternatively, if the screw 90 is turned out, it pushes up against the underside of the tab 74 thereby lifting the tip 72. Not only is it possible to adjust the tip of the finger 70, but it is also possible to move the tip 72 slightly from side to side (to pivot about screw 80 in a horizontal plane). In this way it can be ensured that the tip of the finger is aligned with the corresponding hole in the susceptor.

Once the finger 70 is secured in place and the alignment thereof has been completed, a cover plate 96 (omitted from FIG. 5 for clarity) is placed over the tab 74 to cover the screw 80 and associated washers 82. This cover plate 96 seats in a secondary seat 98 formed in the hoop 78 and is held in place by means of a quarter-turn screw 100 which slots into grooves 102 formed in the sidewalls of the aperture 94 in the tab 74. The grooves 102 are each T-shaped (as illustrated in FIG. 5) and the quarter-turn screw 100, when turned through a quarter of a revolution, engages the cross-bar of the T to lock into place and secure the cover plate 96 in position over the tab 74. This arrangement allows the screw 100, along with the cover plate 96, to be removed easily so that the securing screw 80 and the adjustment screw 90 can be accessed. Both the cover plate 96 and the screw 100 are made from alumina ceramic.

The nuts 84, 92 are covered by and held in position by a flat ceramic plate 104 which slides into a slot 106 formed in the underside of the hoop. The plate 104 and the hoop 78 are both made of ceramic and, it has been found that if the plate 104 and the slot 106 are made to acceptable tolerances the plate 104 is held in position by friction. Accordingly, no fastening devices need be provided to keep the plate 104 in the slot 106. As a result of the arrangement illustrated, the screws 80, 90 are easy to install as the nuts 84, 92 are already held in position by the plate 104 and need not be held manually. FIG. 6 shows that the nuts 84, 92 each have two parallel flat sides which are received in a slot 108 formed in the base of the slot 106. When the flat sides of the nuts 84, 92 are received in this slot 106, the nuts 84, 92 are prevented from rotating when the respective screws 80, 90 are rotated.

Both the plate 104 and the cover plate 96 serve to advantageously cover the few non-ceramic components of the connection mechanism for the lift finger 70. These non-ceramic components are the screws 80, 90, the washers 82 and the nuts 84, 92. As is indicated above, these components are made of metal and, although unlikely, this metal may over time oxidize and generate unwanted particles within the thermal processing chamber environment. If such particles are generated the arrangement described above will serve to contain the particles and minimize the chance of such particles moving into the processing environment of the chamber.

As is evident from the above description the screw 80 is made of a different metal than the Belleville washers 82 and the nut 84. Similarly, the screw 90 is made of a metal different than the nut 92. Typically, nickel and inconel are the two metals used. The reason for using different metals for these components is that this reduces the likelihood of these components welding together by the heat generated during the processing of the semiconductor wafer. It will be readily understood that, although the above description describes the screws 80, 90 as being of inconel and the washers and nuts as nickel, these metals are interchangeable with one another or with any other suitable corrosion resistant material.

One advantage of this invention is that the arrangement provided is much simpler and that no more than two screws, and generally only one screw, is used to adjust the lift finger.

Another advantage of this invention is that far fewer components are provided, therefore making it a cheaper construction.

Yet another advantage of this invention is that misalignment of components does not occur. Even if such misalignment did occur, misaligned components could not interfere with and damage any sensitive equipment within the chamber.

Still a further advantage of this invention is that most of the components are made from an alumina ceramic which does not oxidize and generate particles within the reaction chamber. The elements which are not made from alumina ceramic are made from materials which are generally stable at the operating temperatures in the chamber and are, in any event, covered by cover plates. These cover plates insure that, in the unlikely event that the non-ceramic elements do oxidize, any particles which may be generated by such oxidation are contained and restricted from moving into the processing environment within the chamber.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed:

1. A substrate processing apparatus comprising:
   a thermal reactor including a substrate processing chamber; and
   lifting apparatus for lifting a substrate within the chamber including
   (i) at least one substrate lifting element having a substrate engaging end and a securing tab;
   (ii) a lifting element support having a seat formed therein, wherein the seat is sized to receive the tab of the lifting element;
   (iii) a fastener for securing the tab into the seat; and
   (iv) an adjuster located between the tab and the seat and operable to adjust the position of the substrate engaging end,
   whereby, when the tab is secured in the seat and the adjuster is operated, the lifting element is caused to move in a plane parallel to a plane formed through the center of the fastener and the adjuster.

2. A substrate processing apparatus as recited in claim 1 further comprising: a substrate support located inside the processing chamber and including a substrate supporting surface,
   whereby the supporting surface supports the substrate and the lifting apparatus operates to lift the substrate and hold it clear of the substrate support.

3. A substrate processing apparatus as recited in claim 2, wherein the lifting element support is of generally circular configuration and has at least three seats formed therein, each seat being for receiving a tab associated with a lifting element.

4. A substrate processing apparatus as recited in claim 3, wherein the substrate support located inside the processing chamber has apertures formed therethrough, each aperture being sized to receive the substrate engaging end of the lifting element.

5. A substrate processing apparatus as recited in claim 4, further comprising:
   (i) a support for supporting the lifting element support in a position below the substrate support; and
   (ii) a drive for moving the lifting element support relative to the substrate support,
   whereby the substrate engaging end of each lifting element can be moved through an aperture formed in the substrate support to lift a substrate, supported on the supporting surface, clear of the substrate support.

6. A substrate processing apparatus as recited in claim 1, wherein the adjuster operates to pivot the tab in the seat to cause the lifting element to move in a plane parallel to the plane through the center of the fastener and the adjuster.

7. A substrate processing apparatus as recited in claim 6, wherein each lifting element has a generally U-shaped configuration having the substrate engaging end at the tip of one of the legs of the U-shape and the securing tab located at the end of the other leg of the U-shape.

8. A substrate processing apparatus as recited in claim 7, wherein the fastener includes an elongate fastening element which passes through the tab and the body of the lifting element support, and the adjuster includes an elongate, threaded element which, on rotation, is adjustable in height to vary the spacing between the tab and the seat thereby causing the lifting element to move in a plane parallel to a plane defined by the longitudinal axes of the fastening element and the threaded element respectively.

9. A substrate lifting apparatus for use in a substrate processing apparatus which includes a thermal reactor having a substrate processing chamber and a substrate support located in the chamber, the lifting apparatus comprising:
   (i) a lifting element support having at least one seat formed therein;
   (ii) at least one substrate lifting element, each lifting element having a substrate engaging end and a securing tab sized to be received in the seat;
   (iii) a fastener, associated with each lifting element, for securing the tab into the seat; and
   (iv) an adjuster, associated with each lifting element, located between the tab and the seat and operable to adjust the position of the substrate engaging end,
   whereby, when the tab is secured in the seat and the adjuster is operated, the lifting element is caused to move in a plane parallel to a plane formed through the center of the fastener and the adjuster.

10. A substrate lifting apparatus as recited in claim 9, wherein the adjuster operates to cause the tab to pivot in the seat to cause the lifting element to move in a plane parallel to the plane through the center of the fastener and the adjuster.

11. A substrate lifting apparatus as recited in claim 10, wherein the lifting element support is of generally circular configuration and has at least three seats formed therein, each seat being for receiving a tab associated with a lifting element.

12. A substrate lifting apparatus as recited in claim 11, wherein each lifting element has a generally U-shaped configuration having the substrate engaging end at the tip of one of the legs of the U-shape and the securing tag located at the end of the other leg of the U-shape.

13. A substrate lifting apparatus as recited in claim 12, wherein the fastener includes an elongate fastening element which passes through the tab and the body of the lifting element support, and the adjuster includes an elongate, threaded element which, on rotation, is adjustable in height to vary the spacing between the tab and the seat thereby causing the lifting element to move in a plane parallel to a plane defined by the longitudinal axes of the fastening element and the threaded element respectively.

14. A substrate lifting apparatus as recited in claim 13, further comprising a fastener cover for covering the fastener.

15. A substrate lifting apparatus as recited in claim 14, wherein the tab has an access aperture formed therein through which the adjuster can be accessed.

16. A substrate lifting apparatus as recited in claim 15, wherein the fastener cover includes a tab cover dimensioned to fit over the tab and thereby cover one end of the fastener and a cover plate which, in use, attaches to the lifting element support and covers the other end of the fastener.

17. A substrate lifting apparatus as recited in claim 16, wherein the fastener and the adjuster are made of a metal and the fastener cover, the lifting element and the lifting element support are made of a ceramic.

18. A substrate lifting apparatus as recited in claim 9, wherein the fastener includes bias means for biasing the tab into the seat.

19. A substrate lifting apparatus as recited in claim 18, wherein the adjuster operates to cause the tab to pivot in the seat to cause the lifting element to move against the bias means and in a plane parallel to the plane through the center of the fastener and the adjuster.

20. A substrate lifting apparatus as recited in claim 19, wherein the fastener includes an elongate fastening element which passes through the tab and the body of the lifting element support, and the adjuster includes an elongate, threaded element which, on rotation, is adjustable in height to vary the spacing between the tab and the seat thereby causing the lifting element to move in a plane parallel to a plane defined by the longitudinal axes of the fastening element and the threaded element respectively.

* * * * *